(12) United States Patent
Oh et al.

(10) Patent No.: US 9,923,047 B2
(45) Date of Patent: Mar. 20, 2018

(54) METHOD FOR MANUFACTURING A CAPACITOR FOR SEMICONDUCTOR DEVICES

(71) Applicant: Samsung Electronics Co., Ltd., Suwon-si (KR)

(72) Inventors: Se Hoon Oh, Hwaseong-si (KR); Seongyul Park, Seoul (KR); Chin Moo Cho, Seoul (KR); Yunjung Choi, Seoul (KR); Gyu-Hee Park, Hwaseong-si (KR); Youn-Joung Cho, Hwaseong-si (KR); Younsoo Kim, Yongin-si (KR); Jae Hyoung Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/967,956

(22) Filed: Dec. 14, 2015

(65) Prior Publication Data
US 2016/0197136 A1 Jul. 7, 2016

(30) Foreign Application Priority Data
Jan. 6, 2015 (KR) .................... 10-2015-0001126

(51) Int. Cl.
*H01L 49/02* (2006.01)
*H01L 21/322* (2006.01)

(52) U.S. Cl.
CPC .......... *H01L 28/65* (2013.01); *H01L 21/322* (2013.01); *H01L 28/75* (2013.01)

(58) Field of Classification Search
CPC .............................. H01L 28/65; H01L 21/322
USPC ........................................................ 438/196
See application file for complete search history.

(56) References Cited

U.S. PATENT DOCUMENTS

| | | | |
|---|---|---|---|
| 5,432,116 A | 7/1995 | Keum et al. | |
| 5,972,770 A | 10/1999 | Hsu | |
| 6,150,217 A | 11/2000 | Chang et al. | |
| 6,162,680 A | 12/2000 | Lou | |
| 6,340,622 B1 * | 1/2002 | Lee | H01L 21/3145 257/E21.008 |
| 6,380,580 B1 | 4/2002 | Arita | |
| 6,635,523 B1 * | 10/2003 | Uchiyama | H01L 21/28562 257/E21.011 |
| 7,082,026 B2 * | 7/2006 | Schmidt | H01L 28/75 257/303 |

(Continued)

FOREIGN PATENT DOCUMENTS

| | | |
|---|---|---|
| JP | 4357397 | 11/2009 |
| KR | 20070009285 | 1/2007 |
| KR | 20110075474 | 7/2011 |

*Primary Examiner* — Caleb Henry
(74) *Attorney, Agent, or Firm* — Onello & Mello, LLP

(57) ABSTRACT

The inventive concepts provide semiconductor devices and methods for manufacturing the same in which the method includes forming a capacitor including a bottom electrode, a dielectric layer and a top electrode sequentially stacked on a substrate, and also where formation of the top electrode includes forming a first metal nitride layer on the dielectric layer, and forming a second metal nitride layer on the first metal nitride layer, in which the first metal nitride layer is disposed between the dielectric layer and the second metal nitride layer, and the first metal nitride layer is formed at a temperature lower than a temperature at which the second metal nitride layer is formed.

19 Claims, 15 Drawing Sheets

(56) References Cited

U.S. PATENT DOCUMENTS

| | | |
|---|---|---|
| 7,387,929 B2 | 6/2008 | Lee et al. |
| 8,283,227 B2* | 10/2012 | Hirota ............... H01L 27/10817 257/E21.021 |
| 8,357,583 B2* | 1/2013 | Hirota ............... H01L 21/02178 257/E21.008 |
| 8,546,236 B2 | 10/2013 | Malhotra et al. |
| 2001/0014510 A1* | 8/2001 | Park ..................... C23C 16/308 438/396 |
| 2002/0016045 A1* | 2/2002 | Kim .................. H01L 21/02183 438/396 |
| 2002/0019110 A1* | 2/2002 | Lee .................. H01L 21/02183 438/398 |
| 2002/0025646 A1* | 2/2002 | Kim .................. H01L 21/02183 438/396 |
| 2002/0058376 A1* | 5/2002 | Han .................... H01L 21/3144 438/240 |
| 2003/0054605 A1* | 3/2003 | Kim ....................... H01L 28/55 438/240 |
| 2004/0104420 A1* | 6/2004 | Coolbaugh ............ H01L 28/55 257/310 |
| 2004/0169255 A1* | 9/2004 | Kiyotoshi ........... H01L 23/5223 257/532 |
| 2004/0248362 A1* | 12/2004 | Nakamura .......... H01L 21/7687 438/241 |
| 2005/0287737 A1* | 12/2005 | Park ........................ H01L 28/91 438/239 |
| 2006/0267019 A1 | 11/2006 | Kim et al. |
| 2007/0145525 A1* | 6/2007 | Wang ..................... H01L 28/75 257/532 |
| 2008/0182427 A1* | 7/2008 | Oberbeck ......... H01L 21/28194 438/785 |
| 2008/0188055 A1* | 8/2008 | Wang ..................... H01L 28/60 438/386 |
| 2009/0002917 A1 | 1/2009 | Kil et al. |
| 2009/0093097 A1* | 4/2009 | Kim .................. H01L 21/28044 438/275 |
| 2010/0193955 A1* | 8/2010 | Milligan .................. C23C 16/32 257/751 |
| 2013/0071988 A1* | 3/2013 | Deweerd ................. H01L 28/40 438/396 |
| 2014/0080282 A1* | 3/2014 | Chiang ............ H01L 27/10852 438/396 |
| 2015/0372074 A1* | 12/2015 | Yamamoto ............. H01L 28/60 438/396 |

* cited by examiner

METHOD FOR MANUFACTURING A CAPACITOR FOR SEMICONDUCTOR DEVICES

CROSS-REFERENCE TO RELATED APPLICATION

This U.S. non-provisional patent application claims priority under 35 U.S.C. § 119 to Korean Patent Application No. 10-2015-0001126, filed on Jan. 6, 2015, in the Korean Intellectual Property Office, the disclosure of which is hereby incorporated by reference in its entirety.

BACKGROUND

The inventive concepts relate to semiconductor devices and methods for manufacturing the same. More particularly, the inventive concepts relate to semiconductor devices including capacitors and methods for manufacturing the same.

Capacitors having sufficient capacitances in a limited area have been needed as semiconductor devices have become increasingly highly integrated. The capacitance of a capacitor is directly proportional to a surface area of an electrode and a dielectric constant of a dielectric layer that comprises a capacitor, but is inversely proportional to an equivalent oxide thickness of the dielectric layer. Therefore, to increase the capacitance of a capacitor in a limited area, the surface area of the electrode may be increased by using a three-dimensional structure for the capacitor, by reducing the equivalent oxide thickness of the dielectric layer, and/or by using a material having a high dielectric constant as the dielectric layer.

To increase the surface area of the electrode, a height of a bottom electrode (or a storage electrode) may be increased, and/or an effective surface area of the bottom electrode may be increased using a hemi-spherical grain (HSG), and/or the bottom electrode may have a one cylindrical storage (OCS) shape to use both an inner surface area and an outer surface area of the OCS shape. In addition, materials having a high dielectric constant may be selected, for example a metal oxide layer (e.g., $TiO_2$ or $Ta_2O_5$) and/or a ferroelectric having a perovskite (e.g., $PbZrTiO_3$ (PZT), or $BaSrTiO_3$ (BST)).

SUMMARY

Embodiments of the inventive concepts may provide semiconductor devices capable of reducing a leakage current and methods for manufacturing such devices.

Embodiments of the inventive concepts may also provide semiconductor devices capable of improving reliability and methods for manufacturing such devices.

In one aspect, a method for manufacturing a semiconductor device may include: forming a capacitor including a bottom electrode, a dielectric layer, and a top electrode which are sequentially stacked on a substrate. Forming the top electrode may include: forming a first metal nitride layer on the dielectric layer; and forming a second metal nitride layer on the first metal nitride layer. The first metal nitride layer may be disposed between the dielectric layer and the second metal nitride layer. The first metal nitride layer may be formed at a temperature lower than a temperature at which the second metal nitride layer is formed.

In an embodiment, the first metal nitride layer and the second metal nitride layer may include the same metal element.

In an embodiment, forming the first metal nitride layer may include: performing a chemical vapor deposition (CVD) process using a first organic metal compound as a precursor in a nitrogen or ammonia gas atmosphere.

In an embodiment, the first metal nitride layer may include titanium nitride (TiN), and the first organic metal compound may have a structure expressed by the following chemical formula 1.

[Chemical formula 1]

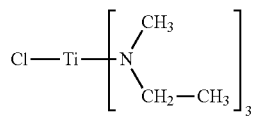

In an embodiment, forming the top electrode may further include: forming a metal oxide layer having conductivity between the dielectric layer and the first metal nitride layer.

In an embodiment, forming the metal oxide layer may include: performing a chemical vapor deposition (CVD) process using a second organic metal compound as a precursor in an ozone gas atmosphere.

In an embodiment, the metal oxide layer may include $TiO_2$, and the first metal nitride layer may include titanium nitride (TiN). In this case, the first and second organic metal compounds may have a structure expressed by the following chemical formula 1.

[Chemical formula 1]

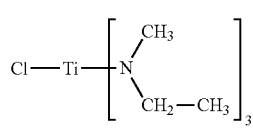

In an embodiment, the metal oxide layer, the first metal nitride layer, and the second metal nitride layer may include the same metal element.

In an embodiment, forming the first metal nitride layer may include:
forming a metal oxide layer on the dielectric layer; and nitrifying at least a portion of the metal oxide layer by a plasma process. The plasma process may use nitrogen or ammonia as a plasma gas.

In an embodiment, the metal oxide layer, the first metal nitride layer, and the second metal nitride layer may include the same metal element.

In an embodiment, forming the metal oxide layer may include: performing a chemical vapor deposition (CVD) process using an organic metal compound as a precursor in an ozone gas atmosphere.

In an embodiment, the metal oxide layer may include $TiO_2$, and the organic metal compound may have a structure expressed by the following chemical formula 1.

[Chemical formula 1]

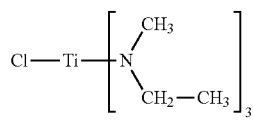

In an embodiment, forming the top electrode may further include: forming a semiconductor layer on the second metal nitride layer. The first metal nitride layer and the second metal nitride layer may be disposed between the dielectric layer and the semiconductor layer.

In another aspect, a method for manufacturing a semiconductor device may include: forming a capacitor including a bottom electrode, a dielectric layer, and a top electrode which are sequentially stacked on a substrate. Forming the top electrode may include: forming a metal nitride layer on the dielectric layer; and converting a phase of at least a portion of the metal nitride layer into an amorphous state by a plasma process. The plasma process may use nitrogen or ammonia as a plasma gas.

In an embodiment, forming the top electrode may further include: forming a semiconductor layer on the metal nitride layer. The metal nitride layer may be disposed between the dielectric layer and the semiconductor layer.

In an embodiment, forming the top electrode may further include: forming an additional metal nitride layer between the metal nitride layer and the semiconductor layer.

In an embodiment, forming the top electrode may further include: forming a metal oxide layer having conductivity between the dielectric layer and the metal nitride layer.

In an embodiment, the metal oxide layer may include the same metal element as the metal nitride layer.

In an embodiment, forming the metal oxide layer may include: performing a chemical vapor deposition (CVD) process using an organic metal compound as a precursor in an ozone gas atmosphere.

In an embodiment, the method may further include: forming an interlayer insulating layer between the substrate and the capacitor; and forming a contact plug in the interlayer insulating layer, the contact plug penetrating the interlayer insulating layer so as to be connected to the substrate. The bottom electrode may be electrically connected to the substrate through the contact plug.

In still another aspect, a semiconductor device may include: a capacitor including a bottom electrode, a dielectric layer, and a top electrode which are sequentially stacked on a substrate. The top electrode may include: a first metal nitride layer on the dielectric layer; and a second metal nitride layer on the first metal nitride layer. The first metal nitride layer may be provided between the dielectric layer and the second metal nitride layer, and the first metal nitride layer may include at least one carbon or oxygen atom.

In an embodiment, the first metal nitride layer and the second metal nitride layer may include the same metal element.

In an embodiment, the top electrode may further include: a metal oxide layer between the dielectric layer and the first metal nitride layer. The metal oxide layer may have conductivity.

In an embodiment, the metal oxide layer, the first metal nitride layer, and the second metal nitride layer may include the same metal element.

In an embodiment, the top electrode may further include: a semiconductor layer on the second metal nitride layer. The first metal nitride layer and the second metal nitride layer may be provided between the dielectric layer and the semiconductor layer.

In yet another aspect, a semiconductor device may include: a capacitor including a bottom electrode, a dielectric layer, and a top electrode which are sequentially stacked on a substrate. The top electrode may include: a semiconductor layer on the dielectric layer; and a first metal nitride layer between the dielectric layer and the semiconductor layer. An upper portion of the first metal nitride layer adjacent to the semiconductor layer may be in an amorphous state.

In an embodiment, the top electrode may further include: an additional metal nitride layer between the first metal nitride layer and the semiconductor layer.

In an embodiment, the additional metal nitride layer may include the same metal element as the first metal nitride layer.

In an embodiment, the top electrode may further include: a metal oxide layer between the dielectric layer and the first metal nitride layer. The metal oxide layer may have conductivity.

In an embodiment, the metal oxide layer may include the same metal element as the first metal nitride layer.

In yet another aspect, a semiconductor device comprises sequentially: a substrate; an interlayer insulating layer on the substrate; a capacitor on the interlayer insulating layer and the capacitor comprises sequentially a bottom electrode, a dielectric layer, and a top electrode; and also the top electrode comprises sequentially lower and upper metal nitride layers having different physical and/or chemical characteristics; and, a semiconductor layer on the second metal nitride layer; and the device further comprises a contact plug that penetrates the interlayer insulating layer so as to electrically connect the bottom electrode of the capacitor to the substrate.

In some embodiments the semiconductor device has a lower metal nitride layer which includes a metal nitride in a crystalline state and an upper metal nitride layer which includes the same metal nitride as the lower metal nitride layer except in an amorphous state.

In some embodiments the semiconductor device has a lower metal nitride layer which includes a metal nitride that contains at least one carbon or oxygen atom, and an upper metal nitride layer which includes the same metal nitride as the lower metal nitride layer except it does not contain a carbon or oxygen atom.

In some embodiments the semiconductor device has a top electrode which further comprises a metal oxide layer having conductivity positioned between the dielectric layer and the lower metal nitride layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
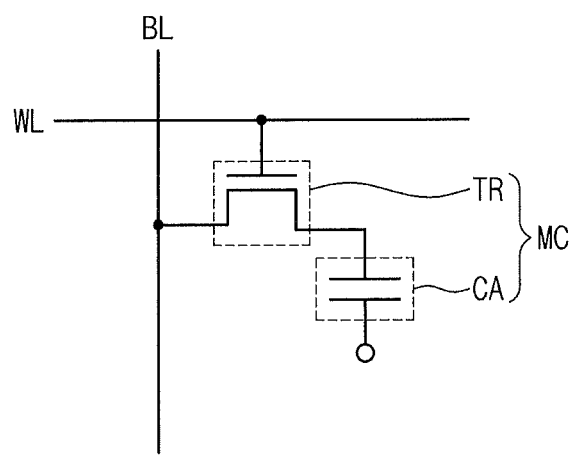
FIG. 1 is a circuit diagram illustrating a unit memory cell of a semiconductor device according to exemplary embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and dimensions are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly on" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shapes illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts as explained and illustrated herein include their complementary counterparts. The same reference numerals or the same reference designators denote the same elements throughout the specification.

Moreover, exemplary embodiments are described herein with reference to cross-sectional illustrations and/or plan illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

As will be understood by those of ordinary skill in this art, devices and methods of forming devices according to various embodiments described herein may be advantageously embodied in many different types of microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in a microelectronic device that includes semiconductor devices according to the present invention concepts. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the device/structure) thereon, as would be illustrated by a plan view of the device/structure.

FIG. 1 is a circuit diagram illustrating a unit memory cell of a semiconductor device according to exemplary embodiments of the inventive concepts.

Referring to FIG. 1, a memory cell MC may be connected between a word line WL and a bit line BL that intersect each other. The memory cell MC may include a transistor TR connected to the word line WL, and a capacitor CA connected to the transistor TR. A drain region of the transistor TR may be connected to the bit line BL, and a source region of the transistor TR may be connected to the capacitor CA. The transistor TR may be configured to selectively control a flow of charges of the capacitor CA. The memory cell CA may store a logic '1' or logic '0' according to whether charges are stored in the capacitor CA or not.

Embodiments of a method for manufacturing a semiconductor device including the memory cell MC of FIG. 1 will be described hereinafter.

Figure 2:
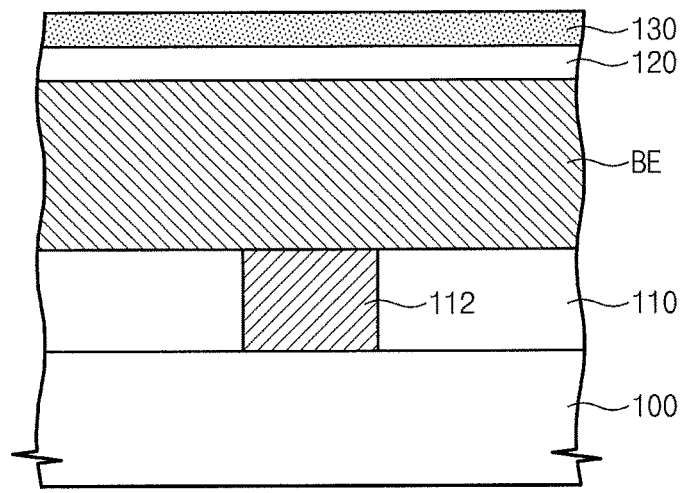
FIGS. 2 to 4 are schematic cross-sectional views illustrating a method for manufacturing a semiconductor device according to some embodiments of the inventive concepts.
Figure 3:
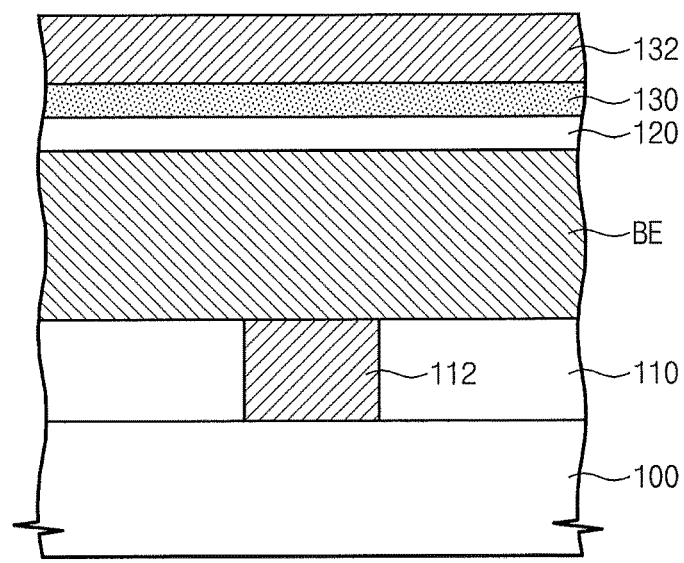
Figure 4:
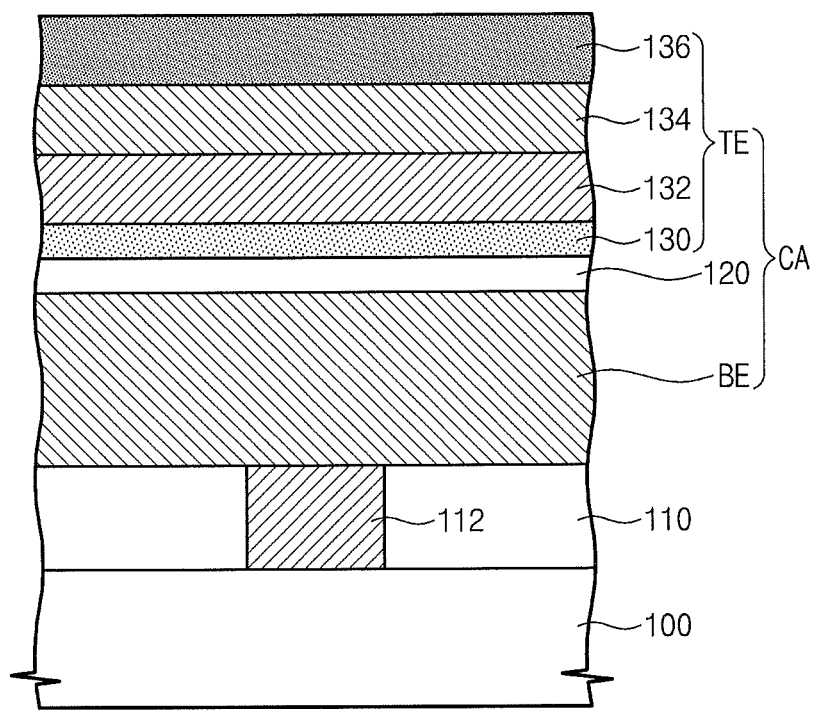

FIGS. 2 to 4 are cross-sectional views illustrating a method for manufacturing a semiconductor device according to some embodiments of the inventive concepts.

Referring to FIG. 2, an interlayer insulating layer 110 may be formed on a substrate 100. The substrate 100 may include a semiconductor substrate. For example, the substrate 100 may include a silicon substrate, a germanium substrate, or a silicon-germanium substrate. In some embodiments, the transistor TR of FIG. 1 may be formed on the substrate 100 of FIG. 2, and the interlayer insulating layer 110 may cover the transistor TR. The interlayer insulating layer 110 may comprise a single-layer or a multi-layer that may include an oxide (e.g., silicon oxide), a nitride (e.g., silicon nitride), and/or an oxynitride (e.g., silicon oxynitride).

A contact plug 112 may be formed in the interlayer insulating layer 110. The contact plug 112 may penetrate the interlayer insulating layer 110 so as to be electrically connected to the substrate 100. If the transistor TR of FIG. 1 is formed on substrate 100, the contact plug 112 may be electrically connected to one terminal of the transistor TR. The contact plug 112 may include a conductive material. For example, the contact plug 112 may include at least one of a semiconductor doped with dopants (e.g., doped silicon, doped germanium, or doped silicon-germanium), a metal (e.g., titanium, tantalum, or tungsten), a conductive metal nitride (e.g., titanium nitride or tantalum nitride), or a metal-semiconductor compound (e.g., a metal silicide).

A bottom electrode BE may be formed on the interlayer insulating layer 110. The bottom electrode BE may be electrically connected to the substrate 100 through the contact plug 112. A shape of the bottom electrode BE will be described later. The bottom electrode BE may include silicon doped with dopants, a metal, or a metal compound.

A dielectric layer 120 may be formed on the bottom electrode BE. The dielectric layer 120 may comprise a single-layer or a multi-layer that includes at least one member selected from a group consisting of metal oxides (e.g., $HfO_2$, $ZrO_2$, $Al_2O_3$, $La_2O_3$, $Ta_2O_3$, and $TiO_2$) and dielectric materials having a perovskite structure (e.g., $SrTiO_3$ (STO), $(Ba,Sr)TiO_3$ (BST), $BaTiO_3$, PZT, and PLZT).

A metal oxide layer 130 may be formed on the dielectric layer 120. The metal oxide layer 130 may be formed by performing an atomic layer deposition (ALD) process or a chemical vapor deposition (CVD) process. In some embodiments, the metal oxide layer 130 may be formed by a CVD process which is performed using a first organic metal compound as a precursor in an ozone ($O_3$) gas atmosphere. For example, the metal oxide layer 130 may include titanium oxide, zinc oxide, or manganese oxide. In some embodiments, if the metal oxide layer 130 includes $TiO_2$, the first organic metal compound used as the precursor in the above-described process may have a structure expressed by the following chemical formula 1.

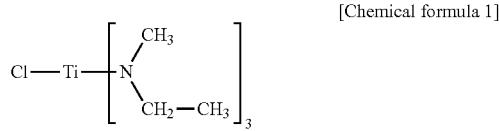

[Chemical formula 1]

The metal oxide layer 130 may be formed to have conductivity. In some embodiments, if the metal oxide layer 130 includes $TiO_2$, the conductivity of the metal oxide layer 130 may be dependent on a thickness of the metal oxide layer 130. In particular, the conductivity of the metal oxide layer 130 may be reduced as the thickness of the metal oxide layer 130 increases. In this case, the metal oxide layer 130 may have a predetermined thickness to insure the desired conductivity of this layer. For example, if the metal oxide layer 130 includes $TiO_2$, the thickness of the metal oxide layer 130 may be about 4 Å or less. Thus, the metal oxide layer 130 may have the desired conductivity.

Referring to FIG. 3, a first metal nitride layer 132 may be formed on the metal oxide layer 130. The first metal nitride layer 132 may be formed by a CVD process that is performed using a second organic metal compound as a precursor in a nitrogen ($N_2$) or an ammonia ($NH_3$) gas atmosphere. For example, the deposition process of the first metal nitride layer 132 may be performed at a temperature of about 400° C. or less. During the deposition process, metal atoms included in the second organic metal compound may be combined with nitrogen atoms included in the nitrogen ($N_2$) or ammonia ($NH_3$) gas to form the first metal nitride layer 132. At least one or some of the carbon atoms included in the second organic metal compound may remain in the first metal nitride layer 132 during the deposition process, so the first metal nitride layer 132 may include at least one carbon atom.

For example, the first metal nitride layer 132 may include titanium nitride, tungsten nitride, tantalum nitride, or molybdenum nitride. In some embodiments, if the first metal nitride layer 132 includes titanium nitride (TiN), the second organic metal compound may have the same structure as the first organic metal compound, which was expressed by the chemical formula 1 described above.

According to some embodiments, the first metal nitride layer 132 may include the same metal element as the metal oxide layer 130. In an embodiment, if the metal oxide layer 130 includes $TiO_2$, the first metal nitride layer 132 may include TiN. In this case, the metal oxide layer 130 and the first metal nitride layer 132 may both be formed using the same organic metal compound as the respective precursors. In other words, each of the first and second organic metal compounds may have the structure expressed by the chemical formula 1 described above.

Referring to FIG. 4, a second metal nitride layer 134 may be formed on the first metal nitride layer 132. The second metal nitride layer 134 may be formed by performing an ALD process or a CVD process.

Because the first metal nitride layer 132 is formed by a CVD process using the second organic metal compound as the precursor (as described with reference to FIG. 3), the first metal nitride layer 132 may be formed at a temperature that is lower than a temperature at which the second metal nitride layer 134 is formed. Generally, an ALD process or a CVD process used to form a metal nitride layer (e.g., a titanium nitride layer) on the dielectric layer 120 might be performed at a relatively high temperature. But because of such a relatively high process temperature, an element (e.g., chlorine (Cl)) of a source gas used in the deposition process may react with a surface of the dielectric layer 120 causing damage to the surface of the dielectric layer 120 during the deposition process. However, according to the present embodiment, the first metal nitride layer 132 may be formed at the relatively lower temperature by a CVD process using the second organic metal compound as the precursor. In this way, damage to the dielectric layer 120 may be minimized during the deposition process of the first metal nitride layer 132.

Also, because the first metal nitride layer 132 is formed by a CVD process using the second organic metal compound as the precursor, the first metal nitride layer 132 may include at least one carbon atom. In this case, a resistance of the first metal nitride layer 132 may be higher than that of the second metal nitride layer 134. In other words, since the resistance of the second metal nitride layer 134 is lower than that of the first metal nitride layer 132, it is possible to reduce or minimize an increase in a total resistance of the multi-layer (e.g., the first and second metal nitride layers 132 and 134) formed on the dielectric layer 120.

For example, the second metal nitride layer 134 may include titanium nitride, tungsten nitride, tantalum nitride, or molybdenum nitride. In some embodiments, the second metal nitride layer 134 may include the same metal element as the first metal nitride layer 132. In an embodiment, the first and second metal nitride layers 132 and 134 may include titanium nitride (TiN). In some embodiments, a sum of the thicknesses of the metal oxide layer 130 and the first and second metal nitride layers 132 and 134 may be about 100 Å or less.

A semiconductor layer 136 may be formed on the second metal nitride layer 134. The semiconductor layer 136 may be formed by performing an ALD process or a CVD process. For example, the semiconductor layer 136 may include silicon-germanium (SiGe) or boron (B)-doped SiGe.

If a single metal-containing layer is disposed between the dielectric layer 120 and the semiconductor layer 136, impurities (e.g., Cl, hydrogen (H), and/or B) provided during the deposition process of forming the semiconductor layer 136 may diffuse through that single layer to the dielectric layer 120. These impurities may then react with the surface of dielectric layer 120, with the result that the dielectric layer 120 may be damaged. However, according to the present embodiment, multi-stacked metal-containing layers including the metal oxide layer 130 and the first and second metal nitride layers 132 and 134 may be disposed between the dielectric layer 120 and the semiconductor layer 136. The impurities may accumulate in the multi-stacked metal-containing layers, but they may not reach the dielectric layer 120, so it is thereby possible to inhibit the impurities from being diffused onto the surface of the dielectric layer 120. As a result, damage to the dielectric layer 120 may be minimized.

Figure 5:
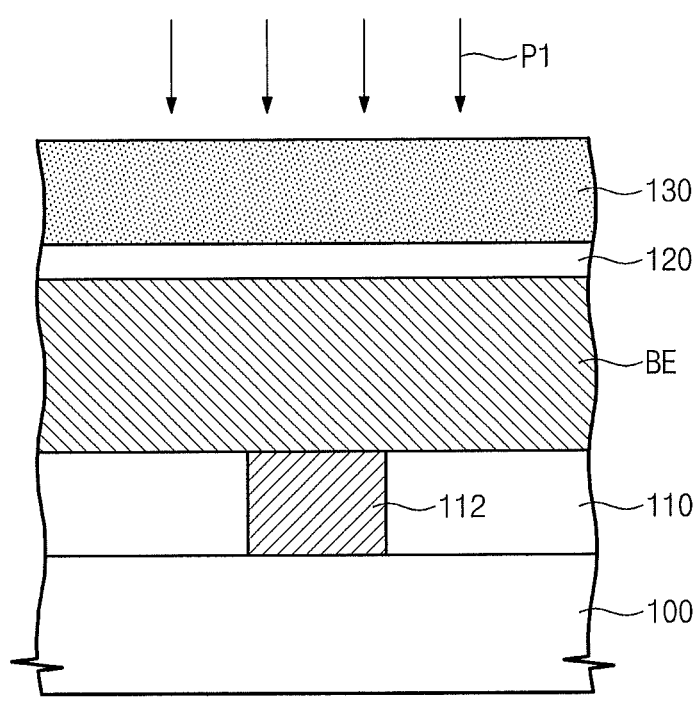
FIGS. 5 to 7 are schematic cross-sectional views illustrating a method for manufacturing a semiconductor device according to other embodiments of the inventive concepts.

The metal oxide layer 130, the first metal nitride layer 132, the second metal nitride layer 134, and the semiconductor layer 136, which are sequentially deposited on the dielectric layer 120, together may constitute a top electrode TE. The bottom electrode BE, the dielectric layer 120, and the top electrode TE together may constitute the capacitor CA described with reference to FIG. 1. The capacitor CA may be electrically connected to the one terminal of the transistor TR formed on the substrate 100 through the contact plug 112 (FIGS. 4 and 5).

Structural features of the semiconductor device manufactured according to some embodiments of the inventive concepts will be described with further reference to FIG. 4.

Referring again to FIG. 4, the interlayer insulating layer 110 may be provided on the substrate 100, and the contact plug 112 may penetrate the interlayer insulating layer 110 so as to be electrically connected to the substrate 100. The contact plug 112 may be electrically connected to the one terminal of the transistor TR provided on the substrate 100.

The capacitor CA may be provided on the interlayer insulating layer 110 and may be connected to the contact plug 112. The capacitor CA may be electrically connected to the one terminal of the transistor TR through the contact plug 112. The capacitor CA may include the bottom electrode BE, the dielectric layer 120, and the top electrode TE which are sequentially stacked on the interlayer insulating layer 110. The bottom electrode BE may be provided between the contact plug 112 and the dielectric layer 120 and may be electrically connected to the substrate 100 through the contact plug 112.

The top electrode TE may include the metal oxide layer 130, the first metal nitride layer 132, the second metal nitride layer 134, and the semiconductor layer 136, which are sequentially stacked on the dielectric layer 120. The metal oxide layer 130 may have conductivity. The first metal nitride layer 132 may include at least one carbon atom, so the resistance of the first metal nitride layer 132 may be higher than that of the second metal nitride layer 134. According to some embodiments, the metal oxide layer 130, the first metal nitride layer 132, and the second metal nitride layer 134 may include the same metal element.

Figure 6:
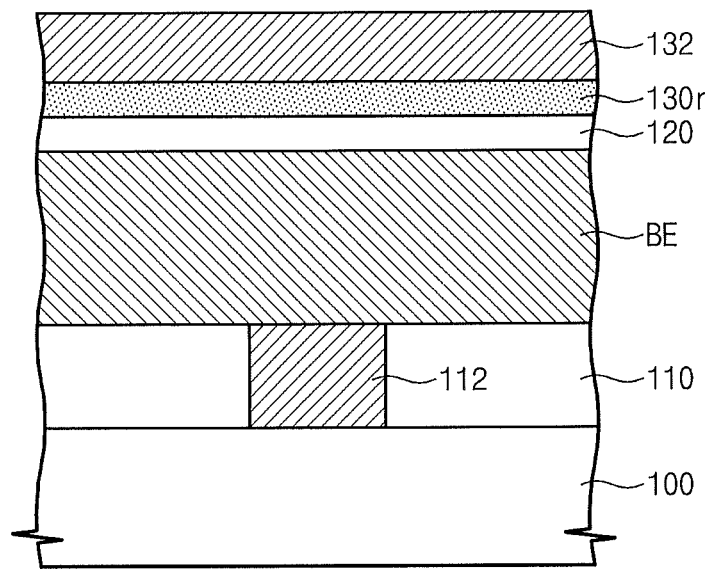
Figure 7:
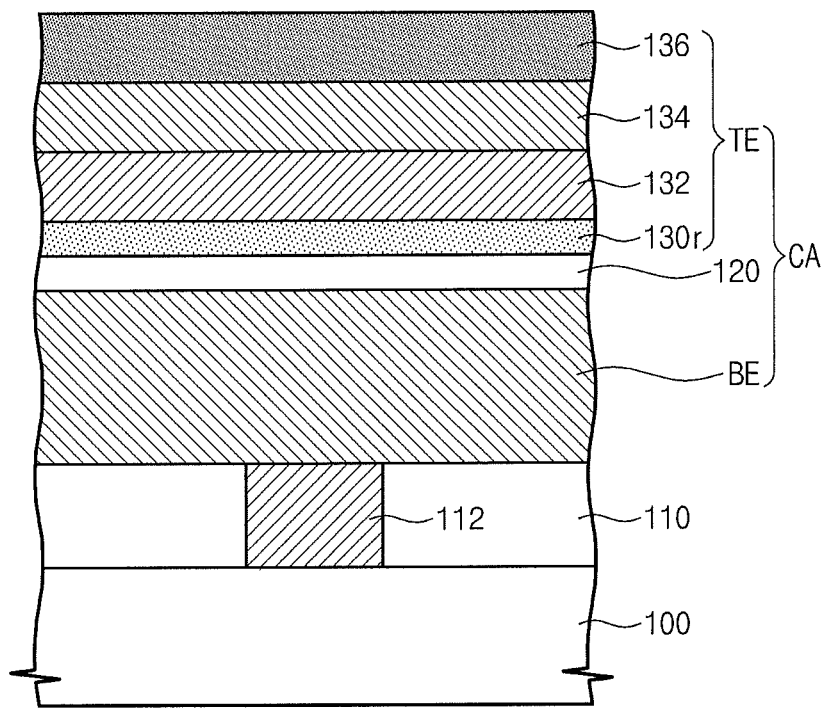

FIGS. 5 to 7 are cross-sectional views illustrating a method for manufacturing a semiconductor device according to other embodiments of the inventive concepts. In the embodiments of FIGS. 5 to 7, the same components as described in the manufacturing method of FIGS. 2 to 4 will be indicated by the same reference numerals or the same reference designators. For the purpose of ease and convenience in explanation, the descriptions relating to the same components as in the manufacturing method of FIGS. 2 to 4 will be omitted or mentioned only briefly.

Referring to FIG. 5, an interlayer insulating layer 110 may be formed on a substrate 100. In some embodiments, the transistor TR of FIG. 1 may be formed on the substrate 100, and the interlayer insulating layer 110 may be formed to cover the transistor TR. A contact plug 112 may be formed to penetrate the interlayer insulating layer 110 and may be electrically connected to the substrate 100. The contact plug 112 may be electrically connected to one terminal of the transistor TR. A bottom electrode BE may be formed on the interlayer insulating layer 110. The bottom electrode BE may be electrically connected to the substrate 100 (e.g., to the one terminal of the transistor TR) through the contact plug 112. A dielectric layer 120 may be formed on the bottom electrode BE.

A metal oxide layer 130 may be formed on the dielectric layer 120. The metal oxide layer 130 may be formed by performing an ALD process or a CVD process. In some embodiments, the metal oxide layer 130 may be formed by a CVD process which is performed using a first organic metal compound as a precursor in an ozone ($O_3$) gas atmosphere. For example, the metal oxide layer 130 may include titanium oxide, zinc oxide, or manganese oxide. In some embodiments, if the metal oxide layer 130 includes $TiO_2$, the first organic metal compound may have the structure expressed by the chemical formula 1 described above.

A first plasma process P1 using nitrogen or ammonia as a plasma gas may be performed on the metal oxide layer 130 to nitrify at least a portion of the metal oxide layer 130. The first plasma process P1 may be performed at a temperature of, for example, about 400° C. or less. In some embodiments, the first plasma process P1 may be performed after the deposition of the metal oxide layer 130. However, the inventive concepts are not limited thereto. In other embodiments, the first plasma process P1 may be performed in-situ during the deposition process of the metal oxide layer 130.

Referring to FIG. 6, at least a portion of the metal oxide layer 130 may be nitrified by the first plasma process P1 to form a first metal nitride layer 132 (which may correspond to the first metal nitride layer 132 of FIGS. 3 and 4). In some embodiments (as illustrated in FIG. 6), an upper portion of the metal oxide layer 130 may be nitrified by the first plasma process P1 to form the first metal nitride layer 132, while a lower portion 130r of the metal oxide layer 130 may remain between the first metal nitride layer 132 and the dielectric layer 120. Since the first metal nitride layer 132 is formed by nitrifying at least a portion of the metal oxide layer 130 in this embodiment, at least one oxygen atom may remain in the first metal nitride layer 132.

The lower portion 130r of the metal oxide layer 130 may have conductivity. In some embodiments, if the metal oxide layer 130 includes $TiO_2$, the conductivity of the metal oxide layer 130 may be dependent on a thickness of the metal oxide layer 130. In particular, the conductivity of the metal oxide layer 130 may be reduced as the thickness of the metal oxide layer 130 increases. In this case, the first plasma process P1 may be performed until the lower portion 130r of the metal oxide layer 130 has a predetermined thickness such that this layer has the desired conductivity. For example, if the metal oxide layer 130 includes $TiO_2$, the first plasma process P1 may be performed until the lower portion 130r of the metal oxide layer 130 has a thickness of about 4 Å or less.

According to the present embodiment, the first metal nitride layer 132 may include the same metal element as the metal oxide layer 130. For example, if the metal oxide layer 130 includes $TiO_2$, the first metal nitride layer 132 may include at least one of titanium nitride (TiN) and titanium oxynitride (TION).

Referring to FIG. 7, a second metal nitride layer 134 may be formed on the first metal nitride layer 132. The second metal nitride layer 134 may be formed by performing an ALD process or a CVD process.

Because the first metal nitride layer 132 is formed by the method of nitrifying at least an upper portion of the metal oxide layer 130 using the first plasma process P1 (as described with reference to FIGS. 5 and 6), the first metal nitride layer 132 may be formed at a temperature that is lower than a temperature at which the second metal nitride layer 134 is formed. Generally, an ALD or CVD process used to form a metal nitride layer (e.g., TiN) on the dielectric layer 120 might be performed at a relatively high temperature. Because of such a relatively high process temperature, an element (e.g., Cl) of a source gas used in the deposition process may react with a surface of the dielectric layer 120 causing damage to the surface of the dielectric layer 120 during the deposition process. However, according to the present embodiment, since the first metal nitride layer 132 is formed at the relatively lower temperature by the first plasma process P1 of nitrifying at least a portion of the metal oxide layer 130, the damage to the dielectric layer 120 may be minimized during the formation of the first metal nitride layer 132.

Also, because the first metal nitride layer 132 is formed by the first plasma process P1 of nitrifying at least a portion of the metal oxide layer 130, the first metal nitride layer 132 may include at least one oxygen atom. In this case, a resistance of the first metal nitride layer 132 may be higher than that of the second metal nitride layer 134. In other words, since the resistance of the second metal nitride layer 134 is lower than that of the first metal nitride layer 132, it is possible to reduce or minimize an increase in the total resistance of the multi-layer (e.g., the first and second metal nitride layers 132 and 134) formed on the dielectric layer 120.

For example, the second metal nitride layer 134 may include titanium nitride, tungsten nitride, tantalum nitride, or molybdenum nitride. In some embodiments, the second metal nitride layer 134 may include the same metal element as the first metal nitride layer 132. For example, the first and second metal nitride layers 132 and 134 may include titanium nitride (TiN). In some embodiments, a sum of the thicknesses of the lower portion 130r of the metal oxide layer 130, the first metal nitride layer 132 and the second metal nitride layer 134 may be about 100 Å or less.

A semiconductor layer 136 may be formed on the second metal nitride layer 134. The semiconductor layer 136 may be formed by performing an ALD process or a CVD process. For example, the semiconductor layer 136 may include SiGe or boron-doped SiGe.

According to the embodiment of FIGS. 6 and 7, multi-stacked metal-containing layers including the lower portion 130r of the metal oxide layer 130, the first metal nitride layer 132, and the second metal nitride layer 134, may be disposed between the dielectric layer 120 and the semiconductor layer 136. Impurities (e.g., Cl, H, and/or B) provided during the deposition process of forming the semiconductor layer 136 may accumulate in the multi-stacked metal-containing layers, but they may not reach the dielectric layer 120, so it is thereby possible to inhibit the impurities from being diffused onto the surface of the dielectric layer 120. As a result, damage to the dielectric layer 120 caused by the impurities may be minimized.

The lower portion 130r of the metal oxide layer 130, the first metal nitride layer 132, the second metal nitride layer 134, and the semiconductor layer 136 which are sequentially deposited on the dielectric layer 120, may together constitute a top electrode TE. The bottom electrode BE, the dielectric layer 120, and the top electrode TE may together constitute the capacitor CA described with reference to FIG. 1. The capacitor CA may be electrically connected to the one terminal of the transistor TR formed on the substrate 100 through the contact plug 112 (FIGS. 6 and 7).

Structural features of the semiconductor device manufactured according to other embodiments of the inventive concepts will be described with further reference to FIG. 7.

Referring again to FIG. 7, the interlayer insulating layer 110 may be provided on the substrate 100, and the contact plug 112 may penetrate the interlayer insulating layer 110 so as to be electrically connected to the substrate 100. The contact plug 112 may be electrically connected to the one terminal of the transistor TR provided on the substrate 100.

The capacitor CA connected to the contact plug 112 may be provided on the interlayer insulating layer 110. The capacitor CA may be electrically connected to the one terminal of the transistor TR through the contact plug 112. The capacitor CA may include the bottom electrode BE, the dielectric layer 120, and the top electrode TE, which are sequentially stacked on the interlayer insulating layer 110. The bottom electrode BE may be provided between the contact plug 112 and the dielectric layer 120 and may be electrically connected to the substrate 100 through the contact plug 112.

The top electrode TE may include the lower portion 130r of the metal oxide layer 130, the first metal nitride layer 132, the second metal nitride layer 134, and the semiconductor layer 136, which are sequentially stacked on the dielectric layer 120. The lower portion 130r of the metal oxide layer 130 may have conductivity. The first metal nitride layer 132 may include the same metal element as the lower portion 130r of the metal oxide layer 130. The first metal nitride layer 132 may include at least one oxygen atom, so the resistance of the first metal nitride layer 132 may be higher than that of the second metal nitride layer 134. In some embodiments, the lower portion 130r of the metal oxide layer 130, the first metal nitride layer 132, and the second metal nitride layer 134 may include the same metal element.

Figure 8:
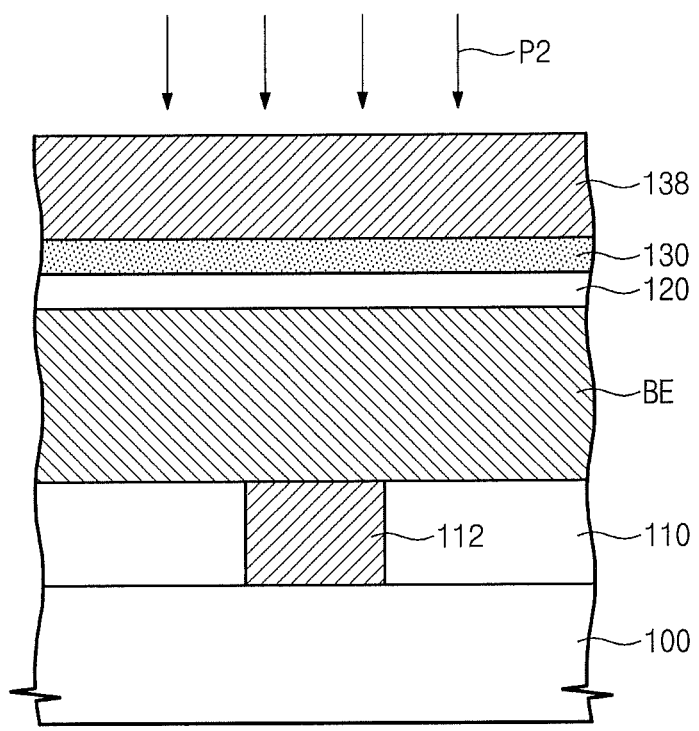
FIGS. 8 and 9 are schematic cross-sectional views illustrating a method for manufacturing a semiconductor device according to still other embodiments of the inventive concepts.
Figure 9:
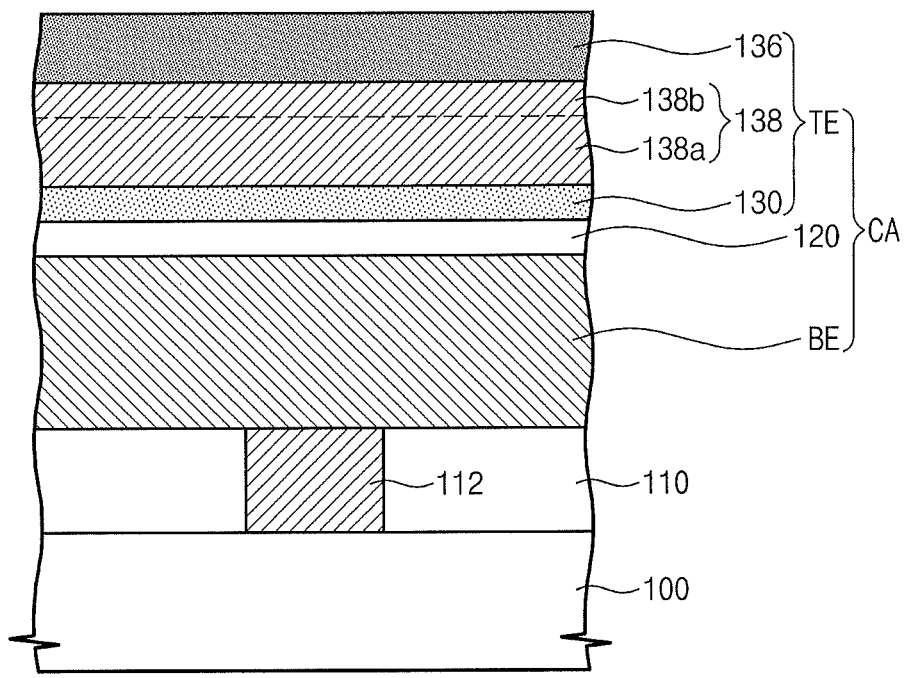

FIGS. 8 and 9 are cross-sectional views illustrating a method for manufacturing a semiconductor device according to still other embodiments of the inventive concepts. In the embodiments of FIGS. 8 and 9, the same components as described in the manufacturing method of FIGS. 2 to 4 will be indicated by the same reference numerals or the same reference designators. For the purpose of ease and convenience in explanation, the descriptions relating to the same components as in the manufacturing method of FIGS. 2 to 4 will be omitted or mentioned only briefly.

Referring to FIG. 8, an interlayer insulating layer 110 may be formed on a substrate 100. In some embodiments, the transistor TR of FIG. 1 may be formed on the substrate 100, and the interlayer insulating layer 110 may be formed to cover the transistor TR. A contact plug 112 may be formed to penetrate the interlayer insulating layer 110. The contact plug 112 may be electrically connected to the substrate 100. The contact plug 112 may be electrically connected to one terminal of the transistor TR. A bottom electrode BE may be formed on the interlayer insulating layer 110. The bottom electrode BE may be electrically connected to the substrate 100 through the contact plug 112. A dielectric layer 120 may be formed on the bottom electrode BE.

A metal oxide layer 130 may be formed on the dielectric layer 120. The metal oxide layer 130 may be formed by performing an ALD process or a CVD process. In some embodiments, the metal oxide layer 130 may be formed by a CVD process which is performed using a first organic metal compound as a precursor in an ozone ($O_3$) gas atmosphere. For example, the metal oxide layer 130 may include titanium oxide, zinc oxide, or manganese oxide. In some embodiments, if the metal oxide layer 130 includes $TiO_2$, the first organic metal compound may have the structure expressed by the chemical formula 1 described above.

The metal oxide layer 130 may be formed to have conductivity. In some embodiments, if the metal oxide layer 130 includes $TiO_2$, the conductivity of the metal oxide layer 130 may be dependent on a thickness of the metal oxide layer 130. In particular, the conductivity of the metal oxide layer 130 may be reduced as the thickness of the metal oxide layer 130 increases. In this case, the metal oxide layer 130 may have a predetermined thickness to provide the desired conductivity of this layer. For example, if the metal oxide layer 130 includes $TiO_2$, the thickness of the metal oxide layer 130 may be about 4 Å or less.

A metal nitride layer 138 may be formed on the metal oxide layer 130. The metal nitride layer 138 may be formed by performing an ALD process or a CVD process. For example, the metal nitride layer 138 may include titanium nitride, tungsten nitride, tantalum nitride, or molybdenum nitride. In some embodiments, the metal nitride layer 138 may include the same metal element as the metal oxide layer 130. For example, if the metal oxide layer 130 includes $TiO_2$, the metal nitride layer 138 may include TiN. A second plasma process P2 using nitrogen or ammonia as a plasma gas may then be performed on the metal nitride layer 138.

Referring to FIG. 9, a phase of at least a portion of the metal nitride layer 138 may be converted into an amorphous state by the second plasma process P2. In some embodiments, a phase of an upper portion of the metal nitride layer 138 may be converted into the amorphous state by the second plasma process P2, so that the metal nitride layer 138 may then comprise a lower portion 138a having a crystalline structure and an upper portion 138b having an amorphous state. In some embodiments, a sum of the thicknesses of the metal oxide layer 130 and the metal nitride layer 138 may be about 100 Å or less.

A semiconductor layer 136 may be formed on the metal nitride layer 138. The semiconductor layer 136 may be formed by performing an ALD process or a CVD process. For example, the semiconductor layer 136 may include SiGe or boron-doped SiGe. In some embodiments, the upper portion 138b of the metal nitride layer 138 may be adjacent to the semiconductor layer 136, and the lower portion 138a of the metal nitride layer 138 may be spaced apart from the semiconductor layer 136 with the upper portion 138b interposed therebetween.

According to the present embodiment, the metal nitride layer 138 may include the upper portion 138b having an amorphous state. Because the upper portion 138b of the metal nitride layer 138 has an amorphous state, it is possible to inhibit impurities (e.g., Cl, H, and/or B) provided during the deposition process of forming the semiconductor layer 136 from being diffused onto the surface of the dielectric layer 120. As a result, damage to the dielectric layer 120 caused by the impurities may be minimized or prevented.

The metal oxide layer 130, the metal nitride layer 138, and the semiconductor layer 136 which are sequentially deposited on the dielectric layer 120 may together constitute a top electrode TE. The bottom electrode BE, the dielectric layer 120, and the top electrode TE may together constitute the capacitor CA described with reference to FIG. 1. The capacitor CA may be electrically connected to the one terminal of the transistor TR formed on the substrate 100 through the contact plug 112 (FIGS. 8 and 9).

Structural features of the semiconductor device manufactured according to still other embodiments of the inventive concepts will be described with reference to FIG. 9.

Referring again to FIG. 9, the interlayer insulating layer 110 may be provided on the substrate 100, and the contact plug 112 may penetrate the interlayer insulating layer 110 so as to be electrically connected to the substrate 100. The contact plug 112 may be electrically connected to the one terminal of the transistor TR provided on the substrate 100.

The capacitor CA connected to the contact plug 112 may be provided on the interlayer insulating layer 110. The capacitor CA may be electrically connected to the one terminal of the transistor TR through the contact plug 112. The capacitor CA may include the bottom electrode BE, the dielectric layer 120, and the top electrode TE, which are sequentially stacked on the interlayer insulating layer 110. The bottom electrode BE may be provided between the contact plug 112 and the dielectric layer 120 and may be electrically connected to the substrate 100 through the contact plug 112.

The top electrode TE may include the metal oxide layer 130, the metal nitride layer 138, and the semiconductor layer 136, which are sequentially stacked on the dielectric layer 120. The metal oxide layer 130 may have conductivity. The metal nitride layer 138 may have the lower portion 138a having the crystalline structure and the upper portion 138b being in the amorphous state. In some embodiments, the metal oxide layer 130 and the metal nitride layer 138 may include the same metal element.

Figure 10:
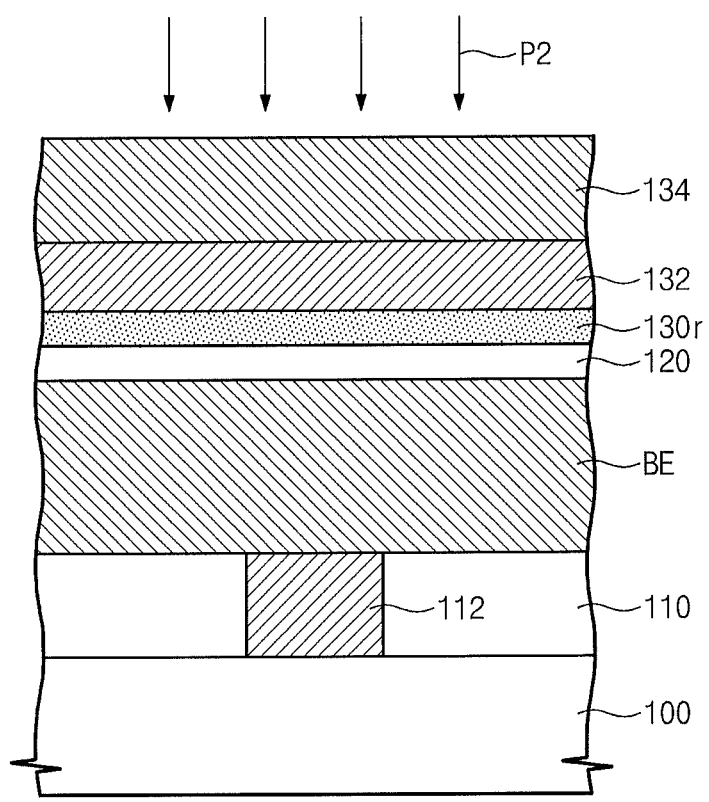
FIGS. 10 and 11 are schematic cross-sectional views illustrating a method for manufacturing a semiconductor device according to yet other embodiments of the inventive concepts.
Figure 11:
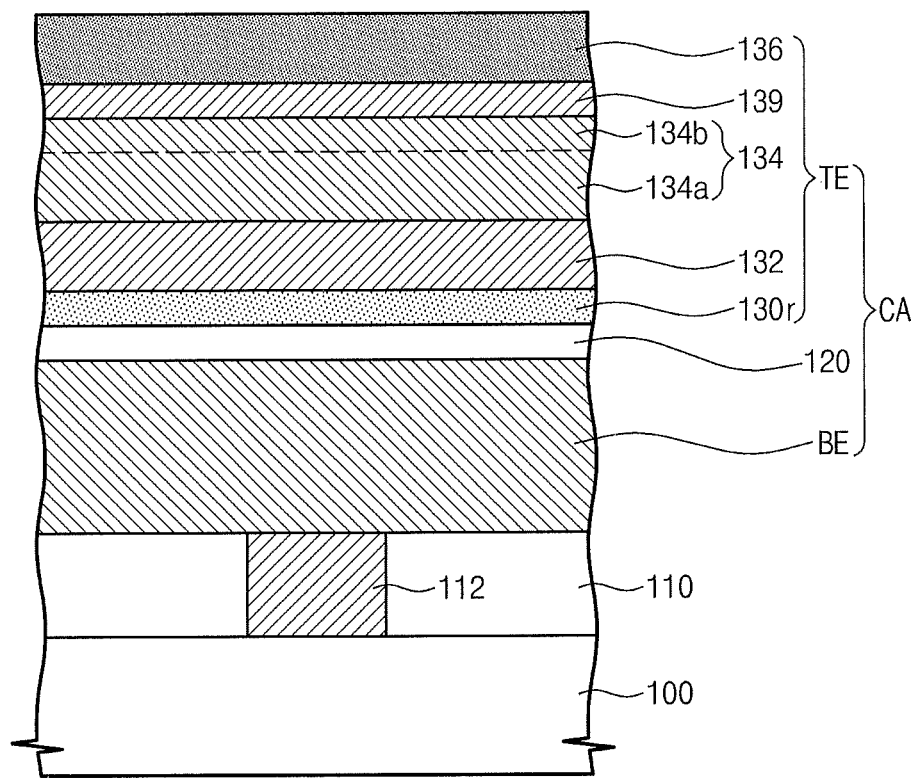

FIGS. 10 and 11 are cross-sectional views illustrating a method for manufacturing a semiconductor device according to yet other embodiments of the inventive concepts. In the embodiments of FIGS. 10 and 11, the same components as described in the manufacturing method of FIGS. 2 to 4 will be indicated by the same reference numerals or the same reference designators. For the purpose of ease and convenience in explanation, the descriptions relating to the same components as in the manufacturing method of FIGS. 2 to 4 will be omitted or mentioned only briefly.

First, an interlayer insulating layer 110 may be formed on a substrate 100, as described with reference to FIGS. 5 and 6. According to some embodiments, the transistor TR of FIG. 1 may be formed on the substrate 100, and the interlayer insulating layer 110 may be formed to cover the transistor TR. A contact plug 112 may be formed to penetrate the interlayer insulating layer 110. The contact plug 112 may be electrically connected to the substrate 100. The contact plug 112 may be electrically connected to one terminal of the transistor TR. A bottom electrode BE may be formed on the interlayer insulating layer 110. The bottom electrode BE may be electrically connected to the substrate 100 through the contact plug 112. A dielectric layer 120 may be formed on the bottom electrode BE.

A metal oxide layer 130 may be formed on the dielectric layer 120 (similar to metal oxide layer 130 as seen in FIG. 5). A first plasma process P1 using nitrogen or ammonia as a plasma gas may be performed on the metal oxide layer 130 to nitrify at least a portion of the metal oxide layer 130 (also similar to the first plasma process P1 as seen in FIG. 5). The first plasma process P1 may be performed at a temperature of, for example, about 400° C. or less. In some embodiments, the first plasma process P1 may be performed after the deposition of the metal oxide layer 130. Alternatively, in other embodiments, the first plasma process P1 may be performed in-situ during the deposition process of the metal oxide layer 130.

At least a portion of the metal oxide layer 130 may be nitrified by the first plasma process P1 to form a first metal nitride layer 132. In some embodiments, such as that illustrated in FIG. 10, an upper portion of the metal oxide layer 130 may be nitrified by the first plasma process P1 to form the first metal nitride layer 132, while a lower portion 130r of the metal oxide layer 130 may remain between the first metal nitride layer 132 and the dielectric layer 120. Since the first metal nitride layer 132 is formed by nitrifying at least a portion of the metal oxide layer 130, at least one oxygen atom may remain in the first metal nitride layer 132.

The lower portion 130r of the metal oxide layer 130 may have conductivity. In some embodiments, if the metal oxide layer 130 includes $TiO_2$, the conductivity of the metal oxide layer 130 may be dependent on a thickness of the metal oxide layer 130. In particular, the conductivity of the metal oxide layer 130 may be reduced as the thickness of the metal oxide layer 130 increases. In this case, the first plasma process P1 may be performed until the lower portion 130r of the metal oxide layer 130 has a predetermined thickness such that this layer has the desired conductivity. For example, if the metal oxide layer 130 includes $TiO_2$, the first plasma process P1 may be performed until the lower portion 130r of the metal oxide layer 130 has a thickness of about 4 Å or less.

The first metal nitride layer 132 may include the same metal element as the metal oxide layer 130. For example, if the metal oxide layer 130 includes $TiO_2$, the first metal nitride layer 132 may include at least one of TiN and TiON.

Referring to FIG. 10, a second metal nitride layer 134 may be formed on the first metal nitride layer 132. The second metal nitride layer 134 may be formed by performing an ALD process or a CVD process.

As described with reference to FIGS. 5 and 6, because the first metal nitride layer 132 is formed by the first plasma process P1 of nitrifying at least a portion of the metal oxide layer 130, the first metal nitride layer 132 may be formed at a temperature that is lower than a temperature at which the second metal nitride layer 134 is formed. As a result, damage to the dielectric layer 120 may be minimized during the formation of the first metal nitride layer 132, as described previously with reference to FIG. 7.

For example, the second metal nitride layer 134 may include titanium nitride, tungsten nitride, tantalum nitride, or molybdenum nitride. In some embodiments, the second metal nitride layer 134 may include the same metal element as the first metal nitride layer 132. For example, the first and second metal nitride layers 132 and 134 may include titanium nitride (TiN).

A second plasma process P2 using nitrogen or ammonia as a plasma gas may then be performed on the second metal nitride layer 134.

Referring to FIG. 11, a phase of at least a portion of the second metal nitride layer 134 may be converted into an amorphous state by the second plasma process P2. In some embodiments, a phase of an upper portion of the second metal nitride layer 134 may be converted into the amorphous state by the second plasma process P2, so that the second metal nitride layer 134 may then comprise a lower portion 134a having a crystalline structure and an upper portion 134b being in the amorphous state.

A third metal nitride layer 139 may be formed on the second metal nitride layer 134. The third metal nitride layer 139 may be formed by performing an ALD process or a CVD process. For example, the third metal nitride layer 139 may include titanium nitride, tungsten nitride, tantalum nitride, or molybdenum nitride. According to some embodiments, the third metal nitride layer 139 may include the same metal element as the second metal nitride layer 134. For example, the second metal nitride layer 134 and the third metal nitride layer 139 may include TiN. In some embodiments, the lower portion 130r of the metal oxide layer 130 and the first, second, and third metal nitride layers 132, 134 and 139, respectively, may include the same metal element. For example, if the lower portion 130r of the metal oxide layer 130 includes $TiO_2$, the first to third metal nitride layers 132, 134 and 139 may include TiN. In some embodiments, a sum of the thicknesses of the lower portion 130r of the metal oxide layer 130 and the first to third metal nitride layers 132, 134 and 139 may be about 100 Å or less.

A semiconductor layer 136 may be formed on the third metal nitride layer 139. The semiconductor layer 136 may be formed by performing an ALD process or a CVD process. For example, the semiconductor layer 136 may include SiGe or boron-doped SiGe. In some embodiments, the upper portion 134b of the second metal nitride layer 134 may be adjacent to the semiconductor layer 136, and the lower portion 134a of the second metal nitride layer 134 may be spaced apart from the semiconductor layer 136 with the upper portion 134b interposed therebetween.

According to the present embodiment, the second metal nitride layer 134 may include the upper portion 134b having an amorphous state. Because the upper portion 134b of the second metal nitride layer 134 has an amorphous state, it is possible to inhibit impurities (e.g., Cl, H, and/or B) provided during the deposition process of forming the semiconductor layer 136 from being diffused onto the surface of the dielectric layer 120. As a result, damage to the dielectric layer 120 caused by the impurities may be minimized or prevented.

In addition, the first metal nitride layer 132 may be formed by the first plasma process P1 of nitrifying at least a portion of the metal oxide layer 130, so the first metal nitride layer 132 may include at least one oxygen atom. In this case, a resistance of the first metal nitride layer 132 may be higher than at least one of those of the lower portion 134a of the second metal nitride layer 134 and the third metal nitride layer 139. In other words, since at least one of the resistances of the lower portion 134a of the second metal nitride layer 134 and the third metal nitride layer 139 is lower than that of the first metal nitride layer 132, it is possible to reduce or minimize an increase in the total resistance of the layers stacked on the dielectric layer 120.

The lower portion 130r of the metal oxide layer 130, the first to third metal nitride layers 132, 134 and 139, and the semiconductor layer 136, which are sequentially deposited on the dielectric layer 120, may together constitute a top electrode TE. The bottom electrode BE, the dielectric layer 120, and the top electrode TE may together constitute the capacitor CA described with reference to FIG. 1. The capacitor CA may be electrically connected to the one terminal of the transistor TR formed on the substrate 100 through the contact plug 112 (FIGS. 10 and 11).

Structural features of the semiconductor device manufactured according to yet other embodiments of the inventive concepts will be described with further reference to FIG. 11.

Referring again to FIG. 11, the interlayer insulating layer 110 may be provided on the substrate 100, and the contact plug 112 may penetrate the interlayer insulating layer 110 so as to be electrically connected to the substrate 100. The contact plug 112 may be electrically connected to the one terminal of the transistor TR provided on the substrate 100.

The capacitor CA connected to the contact plug 112 may be provided on the interlayer insulating layer 110. The capacitor CA may be electrically connected to the one terminal of the transistor TR through the contact plug 112. The capacitor CA may include the bottom electrode BE, the dielectric layer 120, and the top electrode TE, which are sequentially stacked on the interlayer insulating layer 110. The bottom electrode BE may be provided between the contact plug 112 and the dielectric layer 120 and may be electrically connected to the substrate 100 through the contact plug 112.

The top electrode TE may include the lower portion 130r of the metal oxide layer 130, the first metal nitride layer 132, the second metal nitride layer 134, the third metal nitride layer 139, and the semiconductor layer 136, which are sequentially stacked on the dielectric layer 120. The upper portion 130r of the metal oxide layer 130 may have conductivity. The first metal nitride layer 132 may include the same metal element as the lower portion 130r of the metal oxide layer 130. The first metal nitride layer 132 may include at least one oxygen atom, so the resistance of the first metal nitride layer 132 may be higher than at least one of those of the lower portion 134a of the second metal nitride layer 134 and the third metal nitride layer 139. The second metal nitride layer 134 may include the lower portion 134a having the crystalline structure and the upper portion 134b being in the amorphous state. In some embodiments, the lower portion 130r of the metal oxide layer 130 and the first, second, and third metal nitride layers 132, 134 and 139, respectively, may include the same metal element.

Figure 12A:
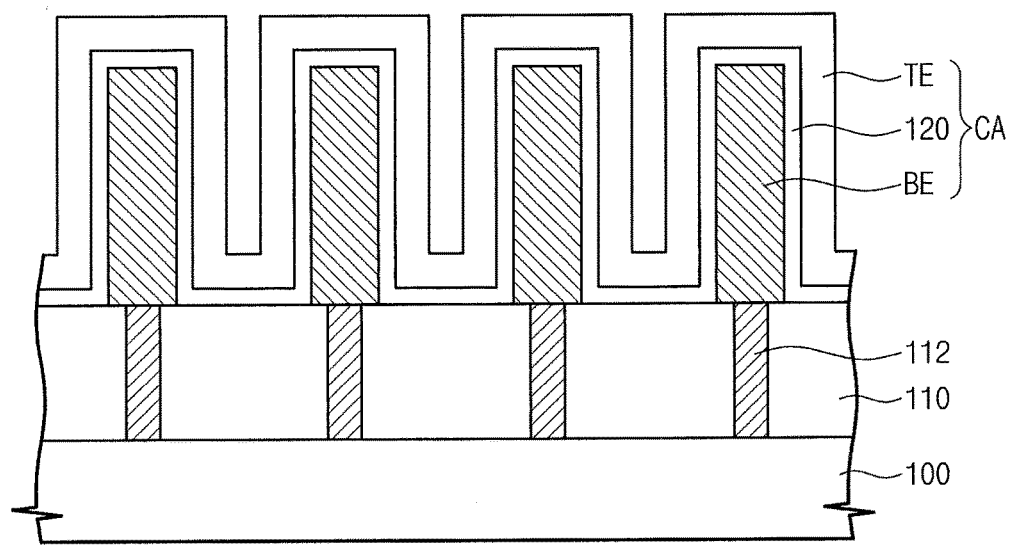
FIGS. 12A, 12B, and 12C are schematic cross-sectional views illustrating shapes of bottom electrodes included in capacitors of semiconductor devices manufactured according to exemplary embodiments of the inventive concepts.
Figure 12B:
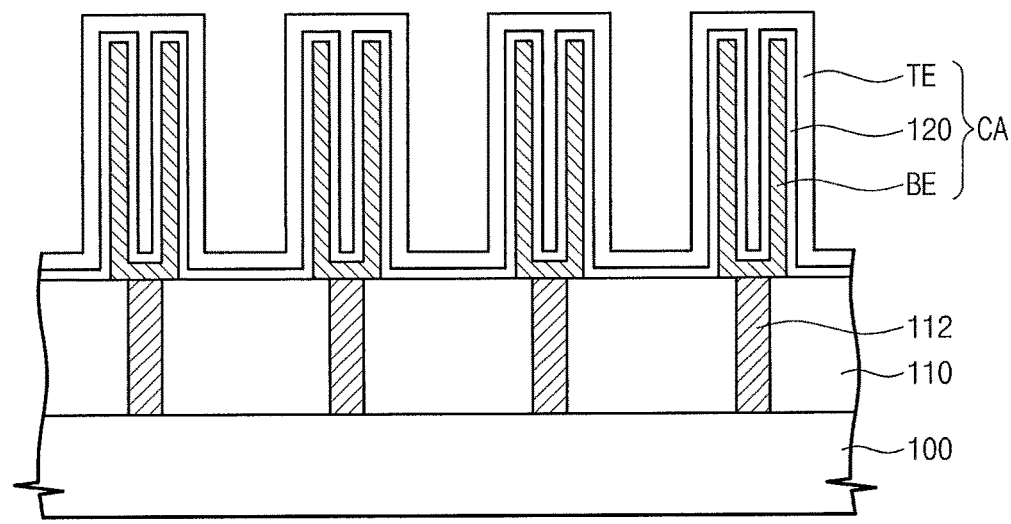
Figure 12C:
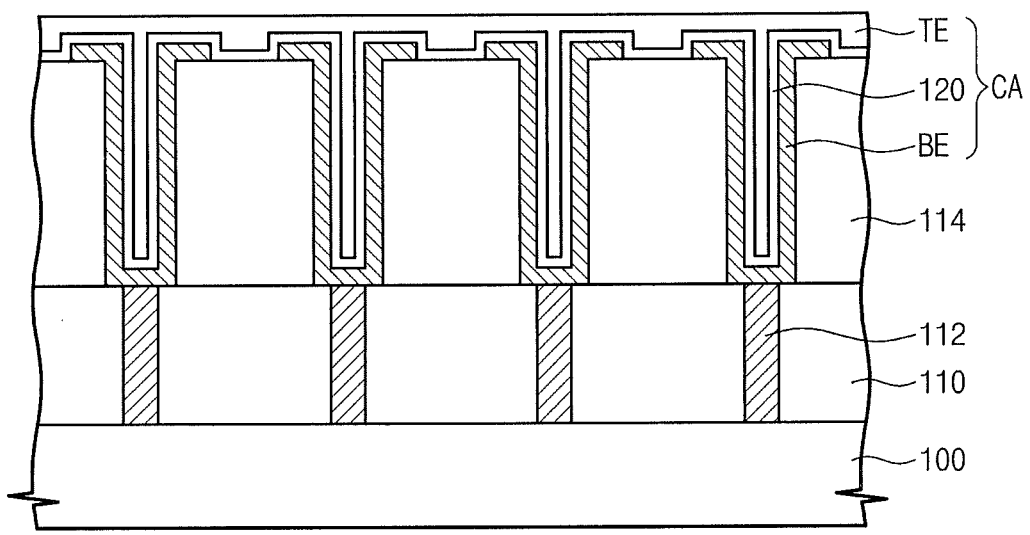

FIGS. 12A, 12B, and 12C are cross-sectional views illustrating shapes of bottom electrodes included in capacitors of semiconductor devices manufactured according to exemplary embodiments of the inventive concepts.

Referring to FIGS. 12A, 12B, and 12C, an interlayer insulating layer 110 may be provided on a substrate 100, and contact plugs 112 may penetrate the interlayer insulating layer 110 so as to be electrically connected to the substrate 100.

Capacitors CA electrically connected to the substrate 100 may be provided on the interlayer insulating layer 110. Each of the capacitors CA may include a bottom electrode BE which is disposed on the interlayer insulating layer 110 so as to be connected to one of the contact plugs 112. The bottom electrodes BE may be electrically connected to the substrate 100 through the contact plugs 112, respectively.

In some embodiments, the bottom electrode BE may have a pillar shape, as illustrated in FIG. 12A. In other embodiments, the bottom electrode BE may have a hollow cylindrical shape having a closed bottom end, as illustrated in FIG. 12B.

In these cases, the capacitors CA may further include a top electrode TE and a dielectric layer 120. The top electrode TE may be disposed on the interlayer insulating layer 110 to cover surfaces of the bottom electrodes BE, and the dielectric layer 120 may be disposed between the top electrode TE and the bottom electrodes BE. The top electrode TE may be a common electrode that covers all of the bottom electrodes BE in common, as illustrated in FIGS. 12A and 12B. In the case that the bottom electrodes BE have the hollow cylindrical shapes as illustrated in FIG. 12B, the top electrode TE may cover both of the inner sidewalls and the outer sidewalls of the hollow cylindrical shape of bottom electrodes BE. The dielectric layer 120 may cover and conform to top surfaces and sidewalls of the bottom electrodes BE and may extend into regions between the top electrode TE and the interlayer insulating layer 110 between adjacent bottom electrodes BE.

In still other embodiments, the bottom electrodes BE may be provided in an upper insulating layer 114 provided on the interlayer insulating layer 110, as illustrated in FIG. 12C. Each of the bottom electrodes BE may have a hollow cylindrical shape having a closed bottom end, and outer sidewalls of the bottom electrodes BE may be in contact with the upper insulating layer 114 as seen in FIG. 12C. Each of the bottom electrodes BE may have an extension portion that extends onto the upper insulating layer 114.

In this case, the top electrode TE may be provided in the upper insulating layer 114 to cover inner sidewalls of the bottom electrodes BE. The dielectric layer 120 may be provided between the top electrode TE and the bottom electrodes BE. The dielectric layer 120 may cover and conform to top surfaces and the inner sidewalls of the bottom electrodes BE and may extend into regions between the top electrode TE and the upper insulating layer 114 between adjacent bottom electrodes BE.

The top electrode TE may include the multi-stacked metal layers which are formed by one of the manufacturing methods according to the embodiments described previously with reference to FIGS. 2 to 11.

[Applications]

Figure 13A:
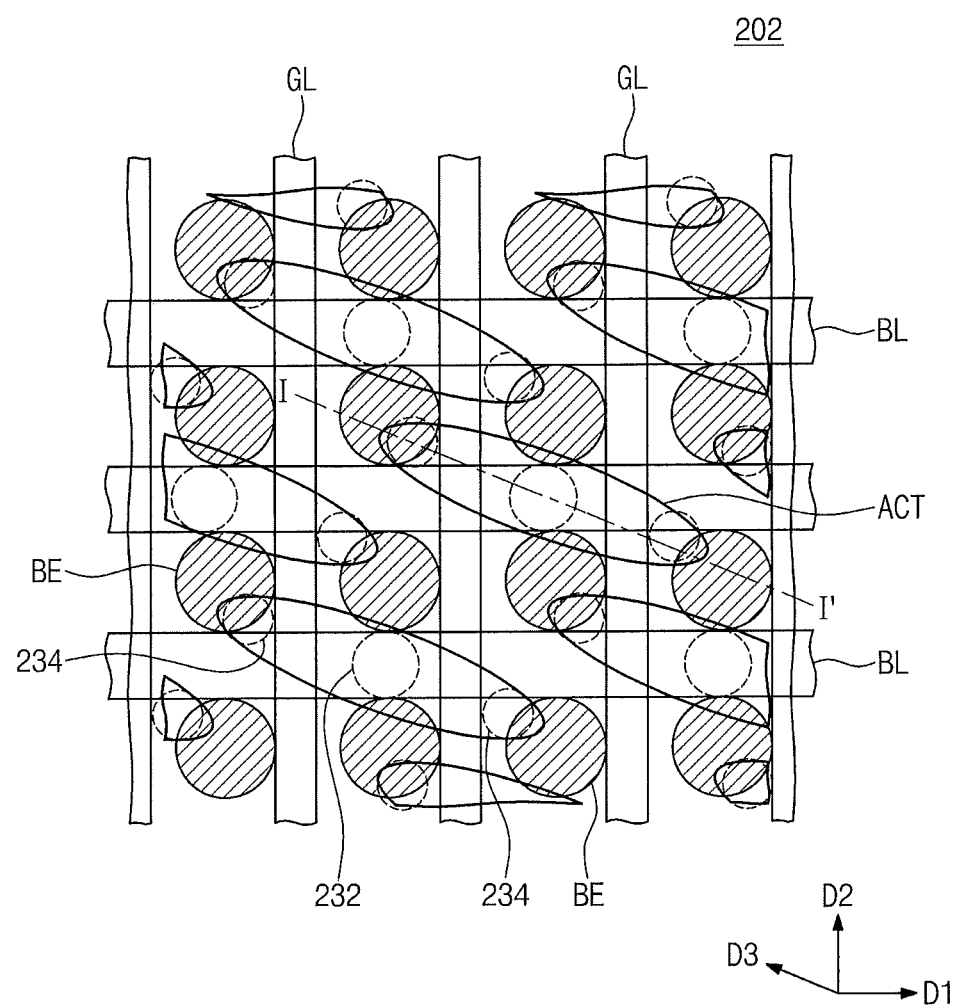
FIG. 13A is a schematic plan view illustrating a semiconductor device manufactured using a manufacturing method according to exemplary embodiments of the inventive concepts.
Figure 13B:
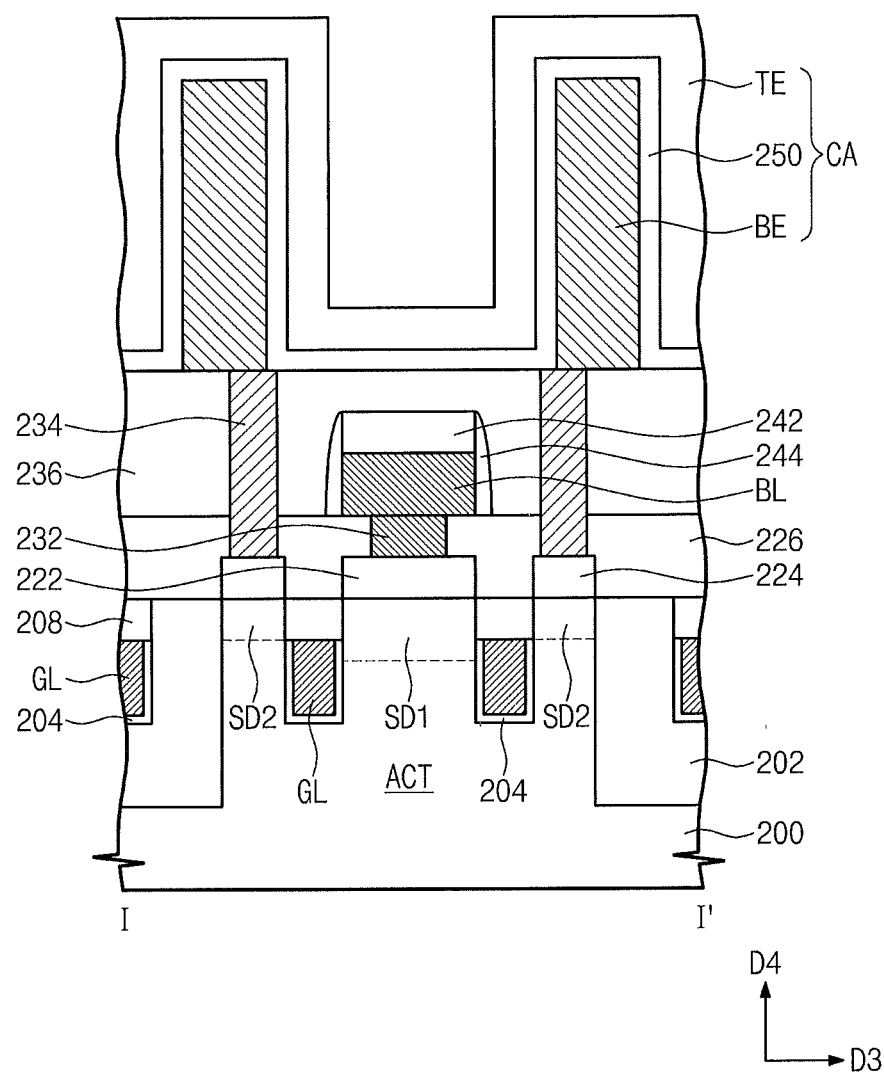
FIG. 13B is a schematic cross-sectional view taken along a line I-I' of FIG. 13A.

FIG. 13A is a plan view illustrating a semiconductor device manufactured using a manufacturing method according to exemplary embodiments of the inventive concepts, and FIG. 13B is a cross-sectional view taken along a line I-I' of FIG. 13A.

Referring to FIGS. 13A and 13B, a device isolation layer 202 may be provided in a substrate 200 to define active regions ACT. The substrate 200 may be a semiconductor substrate (e.g., a silicon substrate, a germanium substrate, or a silicon-germanium substrate). For example, the device isolation layer 202 may include a silicon oxide layer, a silicon nitride layer, and/or a silicon oxynitride layer. Each of the active regions ACT may have a bar shape when viewed from a plan view as shown in FIG. 13A. A long axis of each of the active regions ACT may be parallel to a direction (e.g., a third direction D3) that intersects a first direction D1 and a second direction D2 that intersects the first direction D1 when viewed from a plan view (FIG. 13A).

Gate lines GL that intersect the active regions ACT may be provided in the substrate 200. The gate lines GL may extend in the second direction D2 and may be arranged along the first direction D1. The gate lines GL may be buried in the substrate 200. The gate lines GL may include a conductive material. For example, the gate lines GL may include at least one of a doped semiconductor material (e.g., doped silicon or doped germanium), a conductive metal nitride (e.g., titanium nitride or tantalum nitride), a metal (e.g., tungsten, titanium, and/or tantalum), or a metal-semiconductor compound (e.g., tungsten silicide, cobalt silicide, or titanium silicide).

A gate insulating pattern 204 may be disposed between each of the gate lines GL and the active regions ACT and also between each of the gate lines GL and the device isolation layer 202 (FIG. 13B). For example, the gate insulating pattern 204 may include a silicon oxide layer, a silicon nitride layer, and/or a silicon oxynitride layer.

First capping patterns 208 may be provided on top surfaces of the gate lines GL, respectively, Top surfaces of the first capping patterns 208 may be substantially coplanar with a top surface of the substrate 200 (FIG. 13B). For example, the first capping patterns 208 may include a silicon oxide layer, a silicon nitride layer, and/or a silicon oxynitride layer. In some embodiments, a bottom surface of each of the first capping patterns 208 may be in contact, respectively, with a top surface or edge portion of each of the gate insulating patterns 204, and both sidewalls of each of the first capping patterns 208 may be in contact with the active region ACT and/or with the device isolation layer 202. Alternatively, in other embodiments, the gate insulating pattern 204 may extend into a region between the first capping pattern 208 and the active region ACT and/or into a region between the first capping pattern 208 and the device isolation layer 202. In this case, the first capping pattern 208 may include a silicon nitride layer, and the gate insulating pattern 204 may include a silicon oxide layer. Here, the gate insulating pattern 204 between the first capping pattern 208 and the active region ACT may act as a buffer that releases a stress between the first capping patterns 208 and the active region ACT.

A first dopant injection region SD1 and second dopant injection regions SD2 may be provided in each of the active regions ACT (FIG. 13B). In each of the active regions ACT, the second dopant injection regions SD2 may be spaced apart from each other with the first dopant injection region SD1 interposed therebetween. The first dopant injection region SD1 may be provided in the active region ACT between a pair of gate lines GL adjacent to each other. The second dopant injection regions SD2 may be provided in the active region ACT at both sides of the pair of gate lines GL, respectively, as shown in FIG. 13B. In other words, the second dopant injection regions SD2 may be spaced apart from each other with the pair of gate lines GL and an intermediate first dopant injection region SD1 interposed therebetween. The first dopant injection region SD1 may extend deeper than the second dopant injection regions SD2 into the substrate 200, as seen in FIG. 13B. The first dopant injection region SD1 may be doped with dopants of the same conductivity type as those of the second dopant injection regions SD2.

A first pad 222 connected to the first dopant injection region SD1 and second pads 224 connected to the second dopant injection regions SD2 may be disposed on the substrate 200. The first and second pads 222 and 224 may include a conductive material (e.g., poly-crystalline silicon doped with dopants and/or single-crystalline silicon doped with dopants). A first interlayer insulating layer 226 may be provided on the substrate 200 to cover the first and second pads 222 and 224. The first interlayer insulating layer 226 may include a silicon oxide layer, a silicon nitride layer, and/or a silicon oxynitride layer.

Bit lines BL may be provided on the first interlayer insulating layer 226. The bit lines BL may extend in the first direction D1 and may be arranged along the second direction D2. Each of the bit lines BL may be electrically connected to the first dopant injection region SD1 through a bit line contact 232 that penetrates the first interlayer insulating layer 226 so as to be connected to the first pad 222. For example, the bit lines BL may include at least one of a doped semiconductor material (e.g., doped silicon or doped germanium), a conductive metal nitride (e.g., titanium nitride or tantalum nitride), a metal (e.g., tungsten, titanium, and/or tantalum), or a metal-semiconductor compound (e.g., tungsten silicide, cobalt silicide, or titanium silicide). The bit line contact 232 may include the same material as the bit lines BL.

Second capping patterns 242 may be provided on top surfaces of the bit lines BL, respectively. For example, the second capping patterns 242 may include a silicon nitride layer, a silicon oxide layer, and/or a silicon oxynitride layer. Bit line spacers 244 may be provided on both sidewalls of each of the bit lines BL. For example, the bit line spacers 244 may include a silicon nitride layer, a silicon oxide layer, and/or a silicon oxynitride layer. A second interlayer insulating layer 236 may be provided on the first interlayer insulating layer 226. The second interlayer insulating layer 236 may cover the bit lines BL, the second capping patterns 242, and the bit line spacers 244. In addition, buried contacts 234 may be provided on the substrate 200. The buried contacts 234 may penetrate the first and second interlayer insulating layers 226 and 236, respectively, so as to be connected to the second pads 224, respectively. The buried contacts 234 may include a conductive material such as doped silicon and/or a metal.

Capacitors CA may be provided on the second interlayer insulating layer 236. The capacitors CA may be electrically connected to the second dopant injection regions SD2. The capacitors CA may include bottom electrodes BE which are provided on the second interlayer insulating layer 236 so as to be connected to the buried contacts 234, respectively. The bottom electrodes BE may be electrically connected to the second dopant injection regions SD2 through the buried contacts 234, respectively. In an embodiment, the bottom electrodes BE may have pillar shapes. However, the inventive concepts are not limited thereto. In other words, each of the bottom electrodes BE may have any one of the various shapes described with reference to FIGS. 12A, 12B, and 12C. The bottom electrodes BE may be arranged on the substrate 200 along two dimensions when viewed from a plan view.

The capacitors CA may further include a top electrode TE and a dielectric layer 250 as shown in FIG. 13B. The top electrode TE may be provided on the second interlayer insulating layer 236 so as to cover the bottom electrodes BE, and the dielectric layer 250 may be disposed between the top electrode TE and the bottom electrodes BE. The top electrode TE may be a common electrode that covers all of the bottom electrodes BE in common. The dielectric layer 250 may cover and conform to top surfaces and sidewalls of the bottom electrodes BE and may extend into a region between the top electrode TE and the second interlayer insulating layer 236 between adjacent capacitors.

The bottom electrode BE may include at least one of silicon doped with dopants, a metal, or a metal compound. The dielectric layer 250 may include a single-layer or multi-layer that includes at least one member selected from a group consisting of metal oxides (e.g., $HfO_2$, $ZrO_2$, $Al_2O_3$, $La_2O_3$, $Ta_2O_3$, and $TiO_2$) and dielectric materials having a perovskite structure (e.g., $SrTiO_3$ (STO), $(Ba,Sr)TiO_3$ (BST), $BaTiO_3$, PZT, and PLZT). The top electrode TE may include the multi-stacked metal layers which are formed by one of the manufacturing methods according to the embodiments described previously with reference to FIGS. 2 to 11.

According to the inventive concepts, the top electrode TE of the capacitor may include the multi-stacked metal layers. In some embodiments, the top electrode may include the first metal nitride layer and the second metal nitride layer which are sequentially stacked on the dielectric layer, and the first metal nitride layer may be formed at the temperature lower than that at which the second metal nitride layer is formed. Thus, damage to the dielectric layer may be minimized during the formation of the first metal nitride layer. In addition, because the multi-stacked metal layers are disposed between the dielectric layer and the semiconductor layer of the top electrode, damage to the dielectric layer may be minimized or prevented during the deposition process of forming the semiconductor layer.

In other embodiments, the top electrode may include the metal nitride layer disposed between the dielectric layer and the semiconductor layer, and at least a portion of the metal nitride layer may be in the amorphous state. Thus, damage to the dielectric layer may be minimized or prevented during the deposition process of forming the semiconductor layer.

In addition to minimizing damage to the dielectric layer, a leakage current of the semiconductor device may also be minimized. In other words, the embodiments of the inventive concepts may provide semiconductor devices with excellent reliability and also include methods for manufacturing such semiconductor devices.

Figure 14:
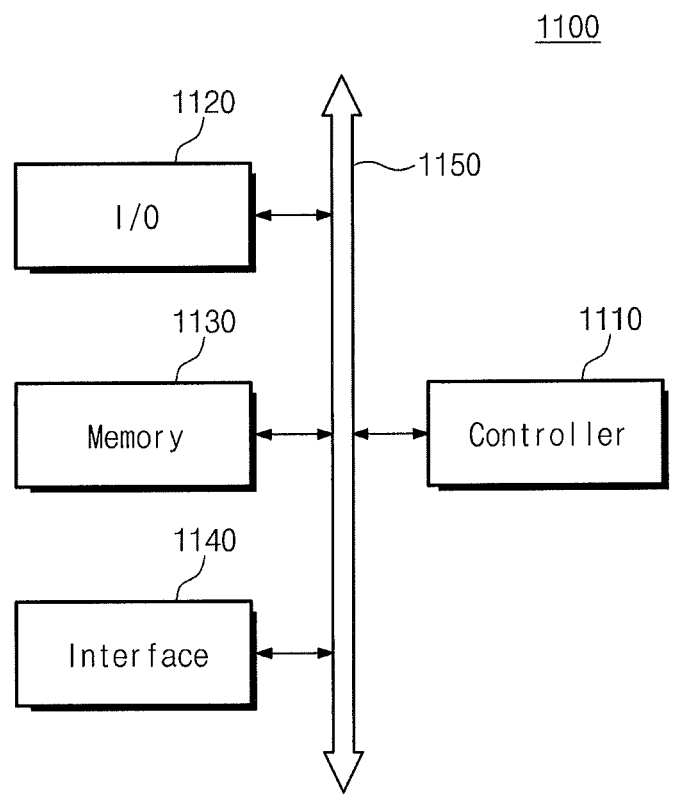
FIG. 14 is a schematic block diagram illustrating an embodiment of an electronic device including a semiconductor device manufactured according to the inventive concepts.

FIG. 14 is a schematic block diagram illustrating an embodiment of an electronic device that includes at least a semiconductor device manufactured according to the inventive concepts.

Referring to FIG. 14, an electronic device 1100 according to the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any of the preceding devices. The I/O unit 1120 may include a keypad, a keyboard and/or a display device. The memory device 1130 may store data and/or commands. The memory device 1130 may include at least one of the semiconductor devices manufactured according to the inventive concepts. The memory device 1130 may further include another type of a semiconductor memory device. The interface unit 1140 may transmit electrical data to a communication network and/or may receive electrical data from the communication network.

The electronic device 1100 may be applied to a laptop computer, a personal digital assistant (PDA), a portable computer, a web tablet, a wireless phone, a mobile phone, a digital music player, a memory card, or other electronic products.

Figure 15:
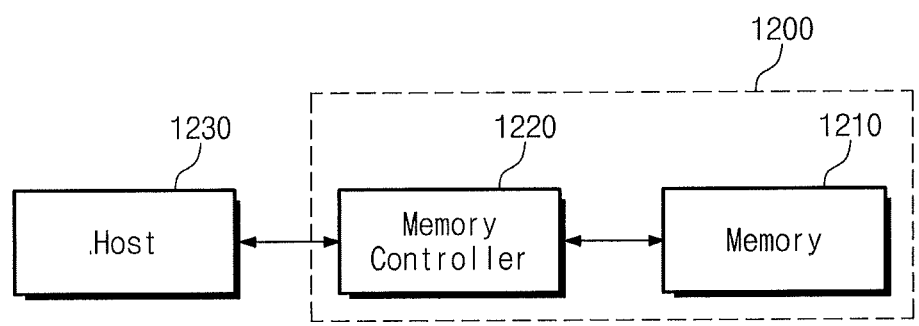
FIG. 15 is a schematic block diagram illustrating an embodiment of a memory card including a semiconductor device manufactured according to the inventive concepts.

FIG. 15 is a schematic block diagram illustrating an embodiment of a memory card that includes at least a semiconductor device manufactured according to the inventive concepts.

Referring to FIG. 15, a memory card 1200 may include a memory device 1210. The memory device 1210 may include at least one of the semiconductor devices manufactured according to the inventive concepts. In addition, the memory device 1210 may further include another type of a semiconductor memory device. The memory card 1200 may also include a memory controller 1220 that controls data communication between the memory device 1210 and a host 1230.

According to the inventive concepts as described above, the top electrode of a capacitor according to the inventive concepts may include the multi-stacked metal layers. In some embodiments, the top electrode may include the first and second metal nitride layers sequentially stacked on the dielectric layer, and the first metal nitride layer may be formed at the temperature lower than that at which the second metal nitride layer is formed. Thus, damage to the dielectric layer may be minimized during the formation of the first metal nitride layer. In addition, the multi-stacked metal layers may be disposed between the dielectric layer and the semiconductor layer of the top electrode, so that damage to the dielectric layer may also be minimized during the deposition process of forming the semiconductor layer.

In other embodiments, the top electrode may include the metal nitride layer disposed between the dielectric layer and the semiconductor layer, and at least a portion of the metal nitride layer may be in the amorphous state. Thus, damage to the dielectric layer may further be minimized during the deposition process of forming the semiconductor layer.

Because damage to the dielectric layer may be minimized according to the inventive concepts, the leakage current of the capacitor may be minimized. As a result, the embodiments of the inventive concepts may provide semiconductor devices with excellent reliability and also include methods for manufacturing such semiconductor devices.

While the inventive concepts have been described with reference to exemplary embodiments, it will be apparent to those skilled in the art that various changes and modifications may be made without departing from the spirit and scope of the inventive concepts. Therefore, it should be understood that the above embodiments are not limiting, but merely illustrative. Thus, the scope of the inventive concepts is to be determined by the broadest permissible interpretation of the following claims and their equivalents, and should not be considered restricted to or limited by the foregoing description.

What is claimed is:

1. A method for manufacturing a semiconductor device, the method comprising:

forming a capacitor including a bottom electrode, a dielectric layer, and a top electrode which are sequentially stacked on a substrate, wherein forming the top electrode comprises:

forming a first metal nitride layer on the dielectric layer; and forming a second metal nitride layer on the first metal nitride layer,
wherein the first metal nitride layer is disposed between the dielectric layer and the second metal nitride layer, and
wherein the first metal nitride layer is formed at a temperature that is lower than a temperature at which the second metal nitride layer is formed;
and also wherein forming the first metal nitride layer comprises: performing a chemical vapor deposition (CVD) process using a first organic metal compound as a precursor in a nitrogen or ammonia gas atmosphere;
and further wherein the first metal nitride layer includes titanium nitride (TiN), and
wherein the first organic metal compound has a structure expressed by the following chemical formula 1,

[Chemical formula 1]

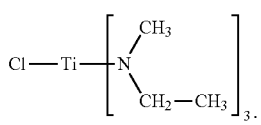

2. The method of claim 1, wherein the first metal nitride layer and the second metal nitride layer include the same metal element.

3. The method of claim 1, wherein forming the top electrode further comprises:
forming a metal oxide layer having conductivity between the dielectric layer and the first metal nitride layer.

4. The method of claim 3, wherein forming the metal oxide layer comprises: performing a chemical vapor deposition (CVD) process using a second organic metal compound as a precursor in an ozone gas atmosphere.

5. The method of claim 4, wherein the metal oxide layer includes TiO$_2$,
wherein the first metal nitride layer includes titanium nitride (TiN), and
wherein the first and second organic metal compounds have a structure expressed by the following chemical formula 1,

[Chemical formula 1]

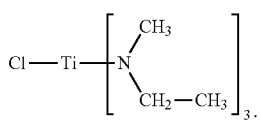

6. The method of claim 3, wherein the metal oxide layer, the first metal nitride layer, and the second metal nitride layer include the same metal element.

7. The method of claim 1, wherein forming the first metal nitride layer comprises:
forming a metal oxide layer on the dielectric layer; and
nitrifying at least a portion of the metal oxide layer by a plasma process,
wherein the plasma process uses nitrogen or ammonia as a plasma gas.

8. The method of claim 7, wherein the metal oxide layer, the first metal nitride layer, and the second metal nitride layer include the same metal element.

9. The method of claim 7, wherein forming the metal oxide layer comprises: performing a chemical vapor deposition (CVD) process using an organic metal compound as a precursor in an ozone gas atmosphere.

10. The method of claim 9, wherein the metal oxide layer includes TiO$_2$, and wherein the organic metal compound has a structure expressed by the following chemical formula 1,

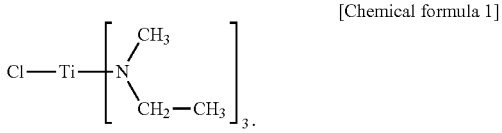

[Chemical formula 1]

11. A method for manufacturing a semiconductor device, the method comprising:
forming a capacitor including a bottom electrode, a dielectric layer, and a top electrode which are sequentially stacked on a substrate,
wherein forming the top electrode comprises:
forming a first metal nitride layer on the dielectric layer; and
forming a second metal nitride layer on the first metal nitride layer,
wherein the first metal nitride layer is disposed between the dielectric layer and the second metal nitride layer, and
wherein the first metal nitride layer is formed at a temperature that is lower than a temperature at which the second metal nitride layer is formed;
and further wherein forming the top electrode further comprises: forming a semiconductor layer on the second metal nitride layer,
wherein the first metal nitride layer and the second metal nitride layer are disposed between the dielectric layer and the semiconductor layer.

12. The method of claim 11, wherein forming the first metal nitride layer comprises: performing a chemical vapor deposition (CVD) process using a first organic metal compound as a precursor in a nitrogen or ammonia gas atmosphere.

13. A method for manufacturing a semiconductor device, the method comprising:
forming a capacitor including a bottom electrode, a dielectric layer, and a top electrode which are sequentially stacked on a substrate,
wherein forming the top electrode comprises:
forming a first metal nitride layer on the dielectric layer; and
converting a phase of at least a portion of the first metal nitride layer into an amorphous state by a plasma process,
wherein the plasma process uses nitrogen or ammonia as a plasma gas.

14. The method of claim 13, wherein forming the top electrode further comprises: forming a semiconductor layer on the first metal nitride layer,
wherein the first metal nitride layer is disposed between the dielectric layer and the semiconductor layer.

15. The method of claim 14, wherein forming the top electrode further comprises: forming an additional metal nitride layer between the first metal nitride layer and the semiconductor layer.

16. The method of claim 13, wherein forming the top electrode further comprises: forming a metal oxide layer having conductivity between the dielectric layer and the first metal nitride layer.

17. The method of claim 16, wherein the metal oxide layer includes the same metal element as the first metal nitride layer.

18. The method of claim 16, wherein forming the metal oxide layer comprises: performing a chemical vapor deposition (CVD) process using an organic metal compound as a precursor in an ozone gas atmosphere.

19. The method of claim 13, further comprising:
forming an interlayer insulating layer between the substrate and the capacitor; and
forming a contact plug in the interlayer insulating layer, the contact plug penetrating the interlayer insulating layer so as to be connected to the substrate,
wherein the bottom electrode is electrically connected to the substrate through the contact plug.

* * * * *